Feb. 9, 1960 A. I. TALKIN ET AL 2,924,786
PULSE-GENERATING MEANS
Filed June 25, 1958
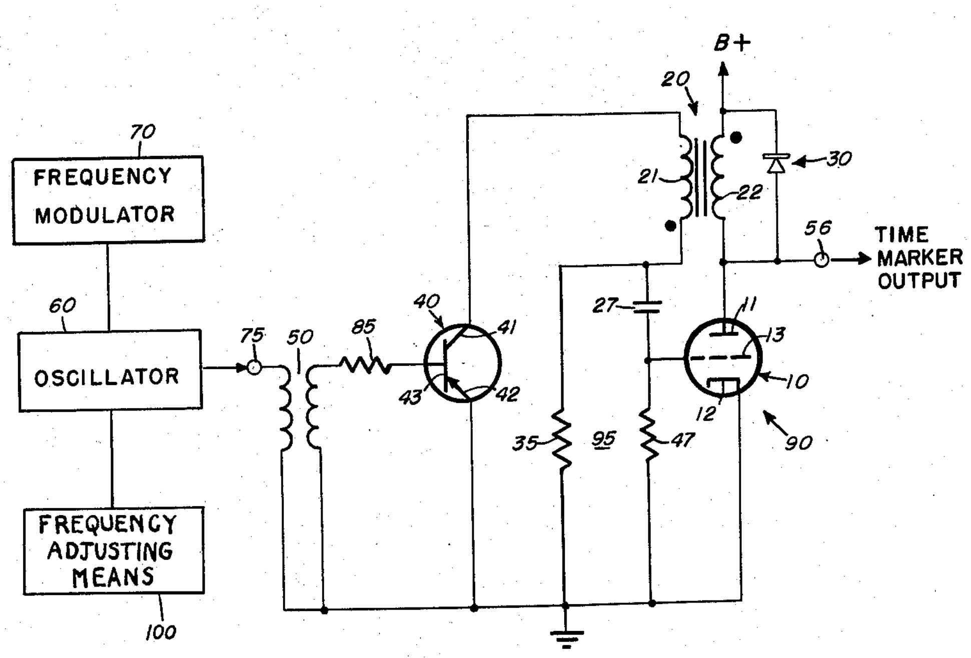
ALBERT I. TALKIN
STANLEY H. GORDON
PHILIP EMILE, JR.
INVENTORS
BY W. E. Thibodeau, A. J. Dupont, J. P. Edgerton & N. Cass United States Patent Office 2,924,786
Patented Feb. 9, 1960

2,924,786

PULSE-GENERATING MEANS

Albert I. Talkin, Stanley H. Gordon, and Philip Emile, Jr., Washington, D.C., assignors to the United States of America as represented by the Secretary of the Army Application June 25, 1958, Serial No. 744,622

2 Claims. (Cl. 331—112)

(Granted under Title 35, U.S. Code (1952), sec. 266)

The invention described herein may be manufactured and used by or for the Government for governmental purposes without the payment to us of any royalty thereon.

This invention relates to pulse-generating electronic circuitry in general, and more particularly to improved means for generating very accurately positioned pulses having a controlled repetition rate and a predetermined pulse width.

In many applications, such as in precision radar tracking circuitry, there is a need for very accurately positioned pulses having a controlled repetition rate and a predetermined pulse width. Accordingly, it is the main object of this invention to provide improved means for generating pulses having these features. It is a further object to provide these improved means in a simple, inexpensive and non-critical circuit.

In a typical embodiment of the invention, these objects are achieved by using a blocking oscillator—with a transistor incorporated in its feedback loop—to provide an output pulse for each negative-going zero crossover point of the sine wave output of a frequency-modulated oscillator having an adjustable frequency control. The frequency modulation of the oscillator provides control of the position of the output pulses, while the oscillator frequency adjustment provides control of the pulse repetition rate.

An important feature of this invention is the incorporation of the transistor in the blocking oscillator circuit. By feeding the sine wave output to the base of the transistor and connecting the emitter and collector of the transistor in the blocking oscillator feedback loop, the switching characteristics of the transistor make possible the detection of the negative-going zero crossover point of the sine wave within a range of about 10 millivolts. Thus, by incorporating the transistor, the blocking oscillator is transformed into a high accuracy zero detection device.

The importance of accurate zero detection by the blocking oscillator can be seen by considering the effect of amplitude modulation of the sine wave output of the oscillator. Such amplitude modulation is inherently produced along with the frequency modulation, and may be quite appreciable where large frequency deviations are desired. This amplitude modulation causes errors in zero detection because the blocking oscillator actually triggers at some finite small voltage, and not at the zero crossover point. Thus, although the zero crossover point occurs at the same position regardless of the sine wave amplitude, the time at which this finite voltage occurs does vary with amplitude, thereby producing errors in the position of the blocking oscillator output pulses. Since the amplitude modulation accompanying a frequency modulation system cannot be reduced without considerably increasing the complexity of the oscillator and frequency modulator, it is important that the zero detection scheme employed be accurate, even with large amplitude modulations of the oscillator sine wave. The high accuracy of zero detection provided by the use of the transistor in the blocking oscillator feedback loop makes it possible to tolerate large amplitude modulations without introducing significant errors in the position of the blocking oscillator output pulses.

Another important feature of this invention is that it has the additional advantage of readily providing a predetermined pulse width, since a blocking oscillator is readily able to accurately provide a wide range of pulse widths.

The specific nature of the invention, as well as other objects, uses, and advantages thereof, will clearly appear from the following description and from the accompanying drawing which shows a block and circuit diagram of the improved pulse-generating means in accordance with the invention.

In the drawing, a frequency modulator 70 is connected to an oscillator 60 to provide a frequency modulated sine wave at the terminal 75 in a conventional manner. The modulation frequency is preferably small compared to the frequency of the sine wave. The frequency of the oscillator 60 is controlled by a frequency adjusting means 100 connected thereto, also in a conventional manner. Where high stability is required the oscillator 60 may be of the crystal type, but in such case the amount of variation of the oscillator frequency will be more limited. As mentioned previously, the sine wave at the terminal 75 will be amplitude modulated along with the frequency modulation. Since considerable amplitude modulation can be tolerated without introducing significant errors as described previously, it will be evident to those skilled in the art that the design of the frequency adjusting means 100, the frequency modulator 70 and the oscillator 60 can be quite simple.

The sine wave output of the oscillator 60 is fed to the base 43 of a transistor 40 by means of a transformer 50. Other suitable coupling means could also be used. The transistor 40 has its collector 41 and its emitter 42 connected in the feedback loop of a blocking oscillator 90. The blocking oscillator 90 includes a vacuum tube 10 and a transformer 20 connected to produce blocking oscillator action in a conventional manner. The blocking oscillator transformer 20 has two windings 21 and 22. The winding 22 is connected between a source of positive D.-C. voltage B+ and the plate 11 of tube 10. The winding 21 is connected between the collector 41 of the transistor 40 and the grid network 95 formed by the resistors 35 and 47 and the capacitor 27. As is well known, the grid network 95 determines the period of oscillation of the blocking oscillator 90. In the present invention, the period of oscillation is chosen to be between one-half and one complete cycle of the sine wave from the crystal oscillator 60. The resistor 17 connected between the grid 13 and ground also serves as the grid resistor for tube 10.

Very accurate zero crossover detection is achieved by the blocking oscillator 90 shown in the drawing because of the switching action of the transistor 40. Most transistors, such as the 2N128 transistor, switch from an impedance of several megohms to several ohms between collector and emitter for voltage changes on the base of the order of about 10 millivolts. Since the blocking oscillator feedback loop gain becomes 1 at an impedance of the order of 20,000 ohms, it is possible to detect the zero crossover point of the input sine wave within about 10 millivolts. If the sine wave from the oscillator 60 applied to the base 43 is about 40 volts peak-to-peak, it is evident that very accurately positioned pulses can be obtained at the blocking oscillator output terminal 56, even with very large changes in the sine wave amplitude. The diode 30 is connected across the winding 22 of the blocking oscillator transformer 20 in a conventional manner to clip off overshoot.

The operation of the circuit shown in the drawing may be described as follows: The transistor 40 is of the PNP type so that it will have the proper polarity in the blocking oscillator feedback loop. When the input sine wave is positive, the transistor 40 is cut off and acts as an impedance of the order of megohms between its collector 41 and emitter 42. The feedback loop is thus open and the blocking oscillator circuit 90 is also cut off. Now, as the sine wave passes zero crossover and becomes a few millivolts negative, the impedance between collector 41 and emitter 42 rapidly falls to close the feedback loop, causing the blocking oscillator 90 to fire and produce a negative pulse at the terminal 56. Any positive overshoot is clipped by the diode 30. Since the period of the blocking oscillator 90 as determined by the grid network 95 is between one-half and one complete cycle of the input sine wave, one time marker pulse is produced for each negative-going zero crossover.

If the blocking oscillator circuit 90 remains cut off for any extended period, the tube 10 may draw an excessive current and may be destroyed. To preserve the tube, therefore, it is necessary that the blocking oscillator circuit 90 continue to run at a sufficient rate, even in the absence of an input sine wave. When the input sine wave is absent, the base 43 of the transistor 40 if returned to ground through a low impedance will maintain the transistor 40 cut off so that the feedback loop will be open. We have found that by using a relatively high value resistor (about 10,000 ohms for a 2N128 transistor) for the base resistor 85, the impedance between the collector 41 and the emitter 42 will rest at a sufficiently low effective value to permit the blocking oscillator circuit 90 to oscillate at an adequate rate in the absence of an input sine wave to prevent overloading the tube 10.

From the above description, it is evident that very accurately positioned pulses can be obtained because of the great accuracy of negative zero crossover detection. The repetition rate of the pulses is readily varied by varying the frequency adjusting means 100 which varies the frequency of the oscillator 60. By well known means, such as by properly choosing the characteristics of the blocking oscillator transformer 20, a wide range of predetermined pulse widths may also be provided for the output pulses. A further advantage of the embodiment of this invention is that because pulse positioning remains very accurate even in the presence of large amounts of amplitude modulation of the sine wave from the oscillator 60, the construction of the oscillator 60 and the frequency modulator 70 is greatly simplified. This is because it is not necessary to take special precautions to reduce the amplitude modulation which ordinarily is produced by simplified frequency modulation techniques.

It should be noted that the improved zero crossover detection achieved by this invention may also be employed for other purposes, such as in amplitude comparison circuits. It is possible, for example, employing this invention to accurately detect when two signals attain equal amplitudes, or when one signal becomes equal to a reference signal.

It will thus be apparent that the embodiment shown is only exemplary and that various modifications can be made in construction and arrangement within the scope of the invention as defined in the appended claims.

We claim as our invention:

1. Improved means for generating very accurately positioned pulses having a controlled repetition rate and a predetermined pulse width, said means comprising in combination: an oscillator, frequency adjusting means connected to said oscillator for controlling the frequency thereof, a frequency modulator also connected to said oscillator so that a frequency modulated sine wave is produced at the output of said oscillator, a vacuum tube having a plate, a grid and a grounded cathode, a blocking oscillator transformer having first and second windings, a PNP transistor having a collector, a base and a grounded emitter, a source of positive D.-C. potential, said first winding being connected between said source and said plate, a first resistor connected between said grid and ground, a capacitor connected between said grid and a first end of said second winding, the other end of said second winding being connected to said collector, a second resistor connected between said first end of said second winding and ground, said first and second windings being connected so that feedback from the plate to the grid of said tube produces blocking oscillator action, the characteristics of said blocking oscillator transformer being chosen to provide a predetermined pulse width at said plate, a diode connected across said first winding to clip off positive overshoot at said plate, said first and second resistors and said capacitor being chosen so that the period of blocking oscillator operation is between one-half and one complete cycle of said sine wave, a coupling transformer having first and second windings, one end of said first and second windings being connected to ground, and a base resistor connected between said base and the other end of the second winding of said coupling transformer, the other end of the first winding of said coupling transformer being connected to said output of said oscillator, each negative-going zero crossover of said sine wave thereby generating a negative pulse at said plate, the characteristics of said blocking oscillator transformer determining the pulse width of the pulses produced, the frequency of said oscillator as controlled by said frequency adjusting means determining the repetition rate of said pulses, and said frequency modulator determining the position of said pulses.

2. The invention in accordance with claim 1, wherein said base resistor is chosen to have a sufficiently large value so that blocking oscillator operation will continue in the absence of said sine wave, thus preventing overloading said tube.

References Cited in the file of this patent

UNITED STATES PATENTS 2,758,206 Hamilton ---------------- Aug. 7, 1956